United States Patent [19]

Kirkendall

[11] 4,167,738

[45] Sep. 11, 1979

[54] ANTENNA MOUNTED TUNING INDICATOR

[76] Inventor: Dennis Kirkendall, 220 Obispe St., Dayton, Ohio 45415

[21] Appl. No.: 810,018

[22] Filed: Jun. 27, 1977

[51] Int. Cl.$^{2}$ ........................ H01Q 1/32; G01R 27/06

[52] U.S. Cl. .................................... 343/703; 343/721; 343/894

[58] Field of Search ................ 343/703, 894, 715, 721

[56] References Cited

U.S. PATENT DOCUMENTS

| | | | |
|---|---|---|---|
| 2,334,279 | 11/1943 | Neiman | 343/703 |
| 3,540,057 | 11/1970 | Persson et al. | 343/703 |
| 3,922,679 | 11/1975 | Campbell | 343/703 |
| 4,051,479 | 9/1977 | Altshuler | 343/703 |

FOREIGN PATENT DOCUMENTS

| | | | |
|---|---|---|---|
| 730132 | 1/1943 | Fed. Rep. of Germany | 343/703 |

*Primary Examiner*—Eli Lieberman
*Attorney, Agent, or Firm*—Jerome P. Bloom

[57] ABSTRACT

A device facilitating the tuning of an antenna system comprising a body having an opening accommodating its mount to and operative connection with a whip, wire or rod type antenna, incorporating means which in the mount thereof inherently forms the secondary of a transformer, the primary of which is provided by the antenna or its loading coil. The secondary is electromagnetically coupled to the primary to have induced therein a R.F. voltage and a resulting current actuates a signal means connected across the secondary. The signal means signals the tuned or untuned condition of the antenna to which the body is applied in accordance with the level of the sensed current.

12 Claims, 4 Drawing Figures

ANTENNA MOUNTED TUNING INDICATOR

BACKGROUND OF THE INVENTION

This invention relates to apparatus designed to lend assistance in the tuning of an antenna, particularly a whip type antenna, in reference to which it will be particularly described.

The installation and use of radio transmitters has rapidly multiplied since the advent of CB radio. It has reached such proportions that a multiple of persons having little skill or knowledge in this field are buying and installing CB radio systems themselves, in their own automotive vehicles. It has been found that many of these persons find great difficulty in properly tuning their antenna systems and it is to the solution of this problem that the present invention is directed.

As to the pertinent prior art, applicant for this Letters Patent knows of no previous invention the disclosure of which indicates a construction which resembles that herein described.

SUMMARY OF THE INVENTION

The present invention provides means for quickly determining the tuned or untuned condition of a rod or wire formed antenna, such as a whip type antenna, which is simple and inexpensive to fabricate, efficient and satisfactory in use and unlike to malfunction. The same means facilitates the adjustment of an antenna to a properly tuned condition where such is required.

A preferred embodiment provides a unitized body structure having an opening enabling that for a proper mount thereof all one needs to do is to slip it over an antenna or its loading coil. This body structure contains a pickup loop or coil which, as the body seats about the antenna or its loading coil adjacent the base of the antenna, inherently forms the secondary of a transformer, the primary of which is the antenna rod or its loading coil per se. A signalling device connected across the output of the pickup loop or coil serves to sense its output and produce a corresponding signal an observation of which will tell the user whether the antenna system is in fact tuned. If the system is not properly tuned, the user will know adjustment of the antenna is necessary, from the nature of the signal.

A primary object of the invention is to provide a simple, inexpensive device for determining the tuned or untuned condition of an antenna which can be efficiently utilized by persons having little knowledge of this field of science.

Another object of the invention is to provide apparatus facilitating the tuning of an antenna system which can be simply slip or friction fit to an antenna or its loading coil, and function without direct electrical connection.

A further object of the invention is to provide a device for tuning and facilitating the tuning of an antenna system incorporating a pickup loop or coil which is in the application thereof to an antenna or its loading coil will be electromagnetically coupled as it inherently forms the secondary of a transformer the primary of which is the antenna or its loading coil.

An additional object of the invention is to provide a simple inexpensive means applicable about the base or root of an antenna to sense the R.F. current therein and product a signal proportional thereto through a connected meter or light emitting device.

Another object of the invention is to provide apparatus useful in tuning an antenna or determining the tuned or untuned condition thereof possessing the advantageous structural features, the inherent meritorious characteristics and the means and mode of use herein described.

With the above and other incidental objects in view as will more fully appear in the specification, the invention intended to be protected by Letters Patent consists of the features of construction, the parts and combinations thereof, and the mode of operation as hereinafter described or illustrated in the accompanying drawings, or their equivalents.

Referring to the drawings wherein are shown some but not necessarily the only forms of embodiment of the invention, FIg. 1 is an exploded perspective view of one embodiment;

Like parts are indicated by similar characters of reference throughout the several views.

Figure 1:
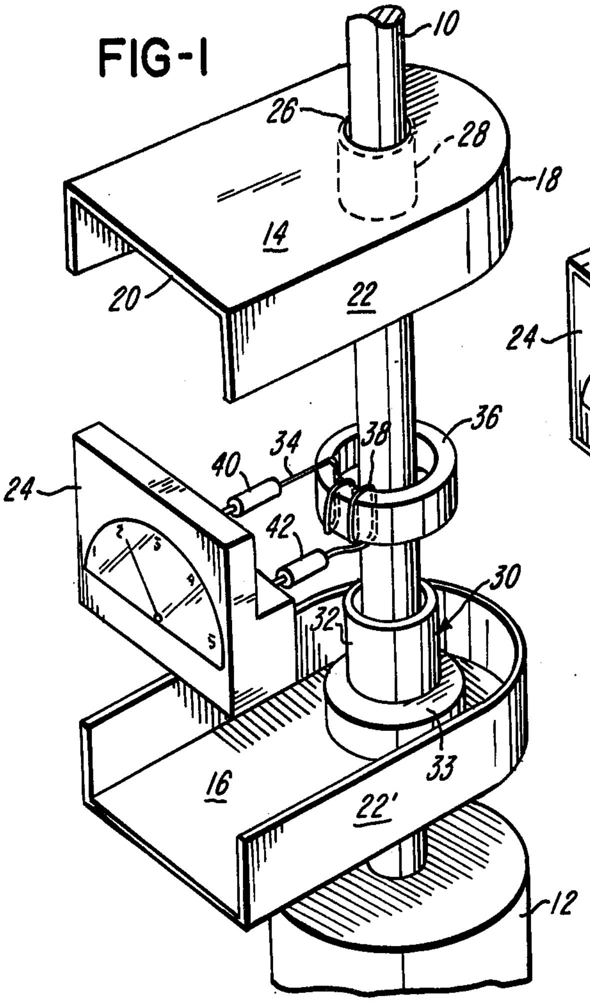

The invention embodiment of FIG. 1 is applied to an antenna 10 the root of which is anchored to a loading coil 12. In this case the antenna and its loading coil are mounted on the exterior of an automotive vehicle and conductively related to the output of a radio transmitter (not shown) mounted within the vehicle.

As may be readily seen from the exploded view thereof, the unitized structure of the invention comprises a housing including a top wall 14 and a bottom wall 16. The walls 14 and 16 each have identical peripheral outlines, including parallel, relatively elongate, straight side edges, an arcuately rounded rear edge 18 formed on a uniform radius, and a front edge 20 formed on a straight line perpendicular to its side edge. The top wall 14 has a downwardly dependent peripheral wall segment 22 which is coextensive with its sides and its rounded rear edge 18 only. The bottom wall has a similar upwardly projected wall segment 22' coextensive with its sides and rounded rear edge only. As the top and bottom walls 14 and 16 and their projected wall segments are brought together, the projected edges of the wall segments 22 and 22' are caused to coextensively abut and thereafter they are eventually secured together, such as by the application of a suitable glue or adhesive applied at their contacting surfaces. The housing so provided leaves an opening at which may be considered its front end. Inserted in this front end opening is a milliameter 24, the pointer and scale of which are faced in a sense outwardly of the enclosure which the body of the millimeter 24 completes.

The top wall 14 and bottom wall 16 each have a single aperture 26 the center of which coincides with the center about which its rear edge 18 has been formed. In the assembly of the housing described, the apertures 26 are directly aligned, one with the other. A tube segment 28 which rims the aperture 26 in the top wall 14 depends therefrom, integral therewith and perpendicular thereto, to project interiorly of and mount in telescoping relation to a tube segment 30. The latter is integral with and projects upwardly from and perpendicular to the bottom wall 16, in rimming relation to its aperture 26. The tube segment 30 has a wall of substantial thickness the upper end portion 32 of which is reduced as to its external diameter to form an annular shoulder 33 which faces the top wall 14.

The meter 24, as seen in FIG. 1, has its input and output connections respectively connected to the respective ends of a single conductive wire 34. A portion of the wire 34 centered between its ends is wrapped around a small portion of the circular extent of a short cylinder 36 to form thereby a coil 38. Inserted in the output end portion of the conductive wire 34 in connection with the input side of the meter 24 is a R.F. diode 40. Inserted in the opposite end portion of the wire 34 is a suitable resistor 42.

The cylinder 36 is made of material having a high magnetic permeability, preferably ferrite and serves as the core of the coil 38. In the application of the cylinder 36 in the housing above described, it seats, together with the coil 38, to the shoulder 33 and about the upper portion 32 of the tube segment 30.

As may be observed from FIG. 1, the total of the operative structure of the invention embodied is housed between the top and bottom walls 14 and 16 and their mating side and rear end wall segments 22 and 22' in such a manner that, as the body of meter 24 completes a seal of the housing so provided, its meter face is outwardly displayed. The structure of the invention, as thus unitized and with all parts suitably secured in place, is enabled by the included apertures 26 and telescoped tube segments 28 and 30 to be slippped over the antenna to its base or adjacent its base. The apparatus of the invention will function as required in the presence of or in the absence of a loading coil 12.

The meter 24 will be designed such that a maximum reading on its scale will indicate resonance, a tuned condition of the antenna 10, for a transmitter of specified output.

The resistor 42 is a calibrating resistor functioning to match the electrical characteristics of the pickup coil 38 to those of the meter 24.

The R.F. diode 40 functions as a one way valve allowing current to flow to the meter at a frequency for which the apparatus of the invention is designed. The uppermost frequency contemplated will determine the selection of the proper R.F. diode.

The coil 38 may have one or more turns.

The application of the unitized structure above described places the pickup coil 38 in an electromagnetically coupled relation to the antenna rod which forms therewith a transformer, the primary of which is the rod 10 and the secondary the pickup coil 38. What the coil 38 senses is the R.F current at the base of the antenna. This current is produced in correspondence with the setting of the related transmitter which for our purposes is desirably the center of the frequency band within which the user intends to operate. In the embodiment of FIG. 1 the portion of tube segment 30 between the shoulder 33 and its base in connection with the bottom wall 16 having substantial thickness insulates the coil 38 and its core 36 from the influence of the loading coil 12, if one is used. The coil 38 is thereby arranged to continuously sense and monitor the R.F. current in that portion of the antenna 10 adjacent to which it positions, the antenna being in use as the radiating element of the connected transmitter. If the reading signalled by the milliameter 24 is not its maximum, the antenna must be adjusted as to its length or other means, if such is provided, to get it tuned. Adjustments required are usually made, after turning the transmitter off, by clipping or otherwise changing the antenna length. The clipping or change necessary may be approximated from the meter reading. The transmitter is then turned on and other meter reading is taken. If the reading is the maximum on the meter scale the antenna system is in resonance and tuned.

The device of the invention is simple in construction and application. It serves as a highly satisfactory aid for determining the tuned or untuned condition of an antenna and a means for determining the degree of adjustment that one would necessarily make to tune an untuned system. Of primary importance is the fact it is a unitized structure which requires no electrical connection to the antenna, the vehicle to which it mounts or any part of the transmission system.

Figure 2:
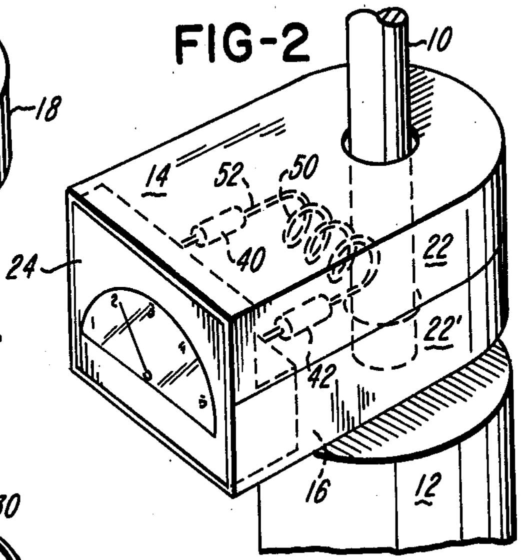
FIG. 2 is a perspective view of a second embodiment.

The embodiment of FIG. 2 comprises a housing including top and bottom walls 14 and 16 having mating and aligned peripheral wall structures 22 and 22' identical in shape and relative position to corresponding parts in the embodiment of FIG. 1 and similarly connected. As in the case of the embodiment of FIG. 1, a milliameter 24 completes the housing, presenting its scale and pointer in an outwardly displayed relation, at the front end thereof. The telescoping tube segments 28 and 30 of FIG. 1 are eliminated in this embodiment which, however, has a through passage the ends of which are defined by the apertures 26. This through passage enables a slip fit of the invention unit over an antenna. In this last respect, it is contemplated as within the scope of the invention to add any conventional friction clip means or other quick fastener to the unit housing to fix the position thereof along an antenna if the particular application should make it desirable.

To this point the embodiment of FIG. 2 generally corresponds in all respects with that of FIG. 1. However, in this case the pickup coil 50 is formed in the intermediate portion of a conductive wire 52, centered between its ends, wherein the conductive wire is made of material capable of maintaining it in a projected relatively fixed relation to the meter 24 in a plane which intersects the longitudinal axis of the antenna at generally right angles thereto. As in the case of the embodiment of FIG. 1, a R.F. diode 40 is inserted in the one end portion of the wire designed to rout current signals to the meter 24 while a calibrating resistor 42 is inserted in the opposite end of the wire which ties to the other connection to the meter 24.

The coil 50, as thus provided, has an air core and is positioned substantially above the bottom wall 16 of its housing and immediately adjacent the antenna 10 to which it is applied. It will thus be essentially insured that the pickup coil is free of intereference from the loading coil 12, if one is present in connection with the antenna. The coil 50 is exposed directly to and senses the R.F. current in the base portion of the antenna 10 adjacent to which it positions. As in the first embodiment, the pickup coil becomes the secondary of a transformer the primary of which is provided by the antenna 10. Similarly the coil applies its output to the meter 24 by way of the R.F. diode 40, balanced by resistor 42.

More specifically, the invention apparatus senses the R.F. current in the root of the antenna by way of coil 50 having a particular orientation. The coil 50 has a voltage impressed on it corresponding to the level of this current and it provides a corresponding output which is rectified by the R.F. diode 40, the latter being a small crystal diode, and then applied to a small meter 24 the reading of which will be proportional to the R.F. current in the antenna 10.

Readings are taken on the meter 24 which represent the R.F. current in the antenna until they show the maximum, indicating resonance, as previously described. Of course adjustment will be signalled and effected as and if necessary.

To summarize the features of the above described embodiments, they are (1) cheap to fabricate; (2) may serve as an uncalibrated tuning aid for the antenna of the types described; (3) foolproof in operation; and (4) negligibly parasitic. Properly calibrated for a specified antenna and transmitter output geometry, the invention embodiment could measure radiated power.

Figure 3:
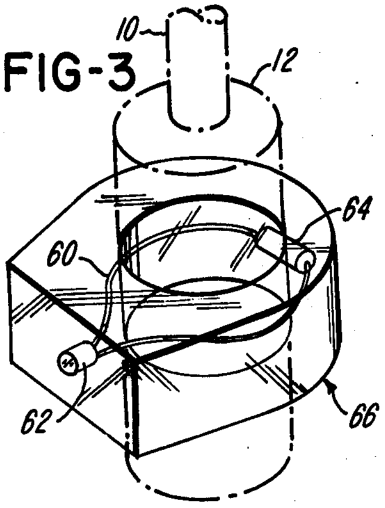
FIG. 3 is a perspective view of a third embodiment.
Figure 4:
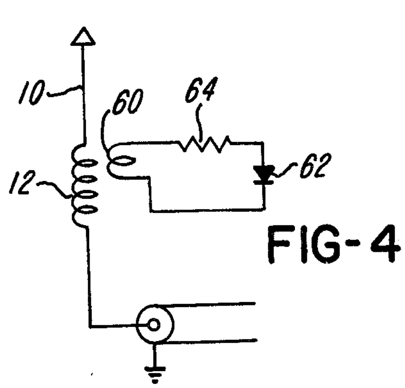
FIG. 4 is a schematic of the application of the embodiment of FIG. 3.

The embodiment of FIGS. 3 and 4 is one of especially minimal cost. In this case the invention unit comprises a single conductive wire 60 formed in a single loop, the free ends of which wire are joined to and connected by a light emitting diode 62. A current limiting resistor 64 is inserted in the portion of the loop 60 remote from the light emitting diode. The assembly so provided, consisting of the entire wire 60, diode 62 and resistor 64 is encased in plastic to produce a body 66 having a ring-like form and including a generally central aperture 68.

The ring-like device so provided is preferably in this case slid over an antenna 10 and frictionally mounted to position over and about loading coil 12, midway between its upper and lower ends. It is contemplated that a spring-loaded clip may be incorporated in the inner peripheral wall of the body 66 to insure a frictional grip thereof, if so required.

Thus, as applied, the loop 60 surrounds the loading coil and serves as a pickup loop and the secondary of a transformer, the primary of which is the loading coil, and also embodies therein both a resistor 64 and the diode 62.

A properly tuned antenna creates an intense electromagnetic field about its loading coil which couples to the pickup loop 60, inducing therein voltage. Current is produced in the process stimulating the diode 62 to emit light. The current limiting resistor 64 protects the diode and prevents its saturation. This last function of resistor 64 permits slight variations of the induced voltage of the pickup loop 60 to be observable as slight variations in the intensity of the light emitted by the diode 62. Such variations are indicative of variations in the current in the loading coil 12 which is the same as that passed to the base or root of the antenna 10. If the current in the loading coil 12 can be tuned to a maximum on a properly designed and installed antenna system, it will be in resonance and functioning properly.

In the use of the embodiment of FIG. 3, resonance is indicated by a maximum uniform brilliance of the light from diode 62. To tune an antenna system would desirably require that the transmitter operator be set in the center of its operating band. The device of FIG. 3 would in the application thereof light up to a particular intensity depending on whether or not the system is in resonance. On rapidly switching the transmitter operator back and forth between the limits of its operating band the eye can observe whether the emitted light stays uniform or varies as to its intensity. If it stays uniform then the system is tuned. If not, the antenna must be adjusted as to its length. In the latter case, if one observes greater brilliance of the light from diode 62 at the upper edge of the operating band than at the lower edge, the antenna is too short and vice versa.

As indicated before the embodiment of FIGS. 3 and 4 is very cheap to fabricate. It may, moreover, be useful at night and it may be permanently installed and effectively used though not as easily perhaps as the embodiments of FIGS. 1 and 2.

It is to be kept in mind that the devices of the inventio are specifically designed for those multitudes of persons who require a simple inexpensive but relatively accurate device to lend assistance in tuning, absent which they normally spend excessive time and money to originally tune and to keep in tune the antenna systems of their transmitters.

It is to be understood that the devices of the invention are not considered to be limited as to the type of transmitters or transceivers with which they may be used.

From the above description it will be apparent that there is thus provided a device of the character described possessing the particular featurs of advantage before enumerated as desirable, but which obviously is susceptible of modification in its form, proportions, detail construction and arrangement of parts without departing from the principle involved or sacrificing any of its advantages.

While in order to comply with the statute the invention has been described in language more or less specific as to structural features, it is to be understood that the invention is not limited to the specific features shown, but that the means and construction herein disclosed comprise but one of several modes of putting the invention into effect and the invention is therefore claimed in any of its forms or modifications within the legitimate and valid scope of the appended claims.

The embodiments of the invention in which an exclusive property or privilege is claimed are defined as follows:

1. Apparatus for use in tuning an antenna system the antenna rod unit of which mounts exterior to a vehicle comprising a body having a fixed opening therein constructed and arranged to mount to the antenna simply by the projection of the antenna rod unit within said opening, said body embodying therein coil means arranged by the mount of said body to position in immediate, spaced proximity to a portion of said antenna rod unit which positions within the limits of said body, in an orientation which disposes it at an essentially right angle thereto, said coil means forming the secondary of a transformer, the primary of which is provided by the portion of the antenna rod unit which positions within the limits of said body, and said coil means including in connection therewith a device incorporated in and forming a part of said body to signal from said body the tuned or untuned condition of the antenana unit to which the body is applied, said coil means being arranged to sense the R.F. current at the base of said rod unit and said body being free of any physical electrical connection to the antenna rod unit or any structure in connection with the vehicle to which it mounts.

2. Apparatus as in claim 1 wherein said coil means is a pickup device wrapped about material which has a high magnetic permeability and formed as a loop the repective ends of which are connected to said signalling device.

3. Apparatus as in claim 1 wherein said coil means comprises a looped portion of a conductive wire the remote ends of which are directly and electrically coupled to said signalling means which is exposed for viewing at an outer surface portion of said body.

4. Apparatus as in claim 1 wherein said coil means is formed to have current limiting resistance providing that slight variations of voltage evidenced therein are observable in the function thereof as slight variations in the signals produced by said signalling device.

5. Apparatus as in claim 1 wherein said signalling device is a meter.

6. Apparatus as in claim 1 wherein said signalling means is comprised of a light emitting diode incorporated in a loop formed wire means which corresponds to a coil with a single turn which further incorporates therein a current limiting resistor and forms therewith said coil means.

7. Apparatus as in claim 1 wherein said coil means is formed in a loop arranged to surround said portion of said antenna rod unit which positions within the limits of said body at right angles thereto and said signalling means is embodied within said loop.

8. Apparatus as set forth in claim 1 wherein said body is constructed and arranged to position in combination with, about and intermediate the ends of a loading coil forming part of the antenna rod unit to which it is applied, and said signalling means is a light emitter diode the intensity of which determines whether or not the antenna rod unit is properly tuned.

9. Apparatus as in claim 8 wherein said housing is a ring-like structure the inner peripheral wall of which embodies spring loaded means to insure a frictional grip of said ring-like structure to the portion of the antenna rod unit to which the same is applied.

10. Apparatus as in claim 1 wherein said body is fabricated of plastic which encases said coil means.

11. Apparatus for use in tuning an antenna system comprising a housing having an opening accommodating the projection therethrough of a portion of an antenna rod unit, a loading coil forming part of the antenna rod unit, said housing being a ring-like structure the inner peripheral wall of which embodies spring loaded means to insure a frictional grip thereof about the loading coil of the antenna rod unit to which it is applied, said housing embodying therein a coil means arranged to position in immediate, spaced, proximity to a portion of said antenna rod unit which positions within the limits of said housing, said coil means forming the secondary of a transformer, the primary of which is provided by the portion of said rod unit which positions within the limits of said housing, and said coil means including in connection therewith a device for signalling the tuned or untuned condition of the antenna unit to which the housing is applied, as said coil means senses the R.F. current at the base of said rod unit, said housing, said coil means and said signalling means providing a completely elf-contained functional unit which can be slipped over any installed rod unit, said signalling means being a light emitting diode, and said coil means including a current limiting resistor to permit slight variations of voltage induced in said coil means in the function thereof to be observable as slight variations in the intensity of the light emitted by the light emitting diode.

12. Apparatus as in claim 11 wherein said housing is a body of plastic which encases said coil means.

* * * * *

UNITED STATES PATENT AND TRADEMARK OFFICE

CERTIFICATE OF CORRECTION

PATENT NO. : 4,167,738

DATED : September 11, 1979

INVENTOR(S) : Dennis Kirkendall

It is certified that error appears in the above-identified patent and that said Letters Patent are hereby corrected as shown below:

Col. 1, line 11, "multiple" is corrected to read -- multitude --;

line 29, "unlike" is corrected to read -- unlikely --;

line 59, "is" is deleted;

line 67, "product" is corrected to read -- produce --.

Col. 2, line 39, "edge" is corrected to read -- edges --;

line 51, "which" is corrected to read -- what --;

line 55, "millimeter" is corrected to read -- milliameter --.

Col. 3, line 20, "embodied" is corrected to read -- embodiment --;

line 50, a period is inserted following -- F --.

Col. 4, line 2, "other" is corrected to read -- another --;

line 51, "intereference" is corrected to read -- interference --.

UNITED STATES PATENT AND TRADEMARK OFFICE

CERTIFICATE OF CORRECTION

PATENT NO. : 4,167,738

DATED : September 11, 1979

INVENTOR(S) : Dennis Kirkendall

It is certified that error appears in the above-identified patent and that said Letters Patent are hereby corrected as shown below:

Col. 6, line 3, "inventio" is corrected to read -- invention --;

line 4, "specifically" is corrected to read -- specially --;

line 15, "featurs" is corrected to read -- features --;

line 50, (Claim 1, line 17) "antenana" is corrected to read -- antenna --;

line 59, (Claim 2, line 4)"repective" is corrected to read -- respective --;

Col. 7, line 20 (Claim 8, line 5) delete comma after "plied";

line 20 (Claim 8, line 5) "emitter" is corrected to read -- emitting --.

Col. 8, line 21 (Claim 11, line 21) "elf" is corrected to read -- self --.

Signed and Sealed this

*Fifteenth* Day of *January 1980*

[SEAL]

*Attest:*

SIDNEY A. DIAMOND

*Attesting Officer* *Commissioner of Patents and Trademarks*